United States Patent [19]
Mucke et al.

[11] Patent Number: 5,715,366
[45] Date of Patent: Feb. 3, 1998

[54] METHOD FOR THE CODED TRANSMISSION OF VOICE SIGNALS

[75] Inventors: Hansjoerg Mucke, Aachen; Peter Baldy, Steinfurt, both of Germany

[73] Assignee: Siemens Aktiengesellschaft, Munich, Germany

[21] Appl. No.: 342,059

[22] Filed: Nov. 17, 1994

[30] Foreign Application Priority Data

Nov. 26, 1993 [DE] Germany .................. 43 40 387.5

[51] Int. Cl.$^6$ .................................................. G10L 3/02
[52] U.S. Cl. .................. 395/2.39; 395/2.1; 395/2.12; 395/2.2; 395/2.33; 395/2.35
[58] Field of Search .................. 395/2.29, 2.13, 395/2.12, 2.39; 341/50, 51, 56; 375/27, 30

[56] References Cited

U.S. PATENT DOCUMENTS

| | | | |
|---|---|---|---|
| 4,677,423 | 6/1987 | Benvenuto et al. | 341/50 |
| 4,860,313 | 8/1989 | Shpiro | 375/27 |
| 5,083,310 | 1/1992 | Drory | 381/30 |
| 5,241,535 | 8/1993 | Yoshikawa | 370/60 |
| 5,317,522 | 5/1994 | Bonet et al. | 364/514 |
| 5,319,573 | 6/1994 | Corleto et al. | 364/514 |

OTHER PUBLICATIONS

M. Dietrich, "Performance and implementation of a Robust ADPCM Algorithm for Wide Band speech Coding with 64 kBit/s", International Zurich on Digital Communication, 1984, pp. 1–8.

"Performance and Implementation of a Robust ADPCM Algorithm for Wideband Speech Coding with 64 kbits/sec", Dietrich, 1984 International Zurich Seminaron Digital Communications, Mar. 4, 1984.

Primary Examiner—Allen R. MacDonald
Assistant Examiner—Michael Opsasnick
Attorney, Agent, or Firm—Hill, Steadman & Simpson

[57] ABSTRACT

In general terms the present invention is a method for the coded transmission of voice signals. A voice signal is digitized and supplied to an encoder and the estimated input signal is subtracted from the digitized voice signal. The remaining remainder signal is normed in that it is divided by its estimated intensity. The norm signal which has arisen as a result thereof is supplied to a quantizer/coder. The output signal thereof is transmitted via a channel and is supplied to a decoder and is also subsequently supplied to an inverse quantizer whose output signal is multiplied by the estimated intensity. The signal that proceeded from the multiplication of the estimated intensity by the output signal of the inverse quantizer is added to the estimated signal, as a result whereof the control signal for a predictor is formed which generates the estimated signal and the decoding ensues analogously to the coding. The estimated intensity is calculated in the following way: the amount of the output signal of the inverse quantizer is formed, and then deviations of the amount of this output signal from 1 are accumulated and limited upon attenuation of the higher-frequency signal parts. The calculation of the estimated intensity ensues using the exponential function $2^x$, whereby only the whole-numbered part of x is taken into consideration.

5 Claims, 3 Drawing Sheets

METHOD FOR THE CODED TRANSMISSION OF VOICE SIGNALS

BACKGROUND OF THE INVENTION

Transmitting and storing spoken language with digital systems provides practical advantages, such as good reproducability, very long-term constancy and low susceptibility to disruption. In addition, voice can be coded with suitable methods, so that the data set required for the transmission or, respectively, storing thereof is significantly reduced. Such a prior art method was presented by Mr. Manfred Dietrich in 1984 at the "International Zurich Seminar on Digital Communications" and involved a proposal for the CCITT Standard for 64 kbit/s broadband voice coding.

SUMMARY OF THE INVENTION

It is an object of the present invention to simplify the known method with respect to the calculation of the estimated intensity value, particularly to reduce the calculating time required.

In general terms the present invention is a method for the coded transmission of voice signals. A voice signal is digitized and supplied to an encoder and the estimated input signal is subtracted from the digitized voice signal. The remaining remainder signal is normed in that it is divided by its estimated intensity. The norm signal which has arisen as a result thereof is supplied to a quantizer/coder. The output signal thereof is transmitted via a channel and is supplied to a decoder and is also subsequently supplied to an inverse quantizer whose output signal is multiplied by the estimated intensity. The signal that proceeded from the multiplication of the estimated intensity by the output signal of the inverse quantizer is added to the estimated signal, as a result whereof the control signal for a predictor is formed which generates the estimated signal and the decoding ensues analogously to the coding. The estimated intensity is calculated in the following way: the amount of the output signal of the inverse quantizer is formed, and then deviations of the amount of this output signal from a value of one are accumulated and limited upon attenuation of the higher-frequency signal parts.

The calculation of the estimated intensity ensues using the exponential function $2^x$, whereby only the whole-numbered part of x is taken into consideration.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

The coding method set forth below is an ADPCM-CODEC with recursive predictor (M. Dietrich, "Performance and Implementation of a Robust ADPCM Algorithm for Wide Band Speech Coding with 64 kbits/s", International Zurich Seminar on Digital Communications, 1984).

Figure 1:
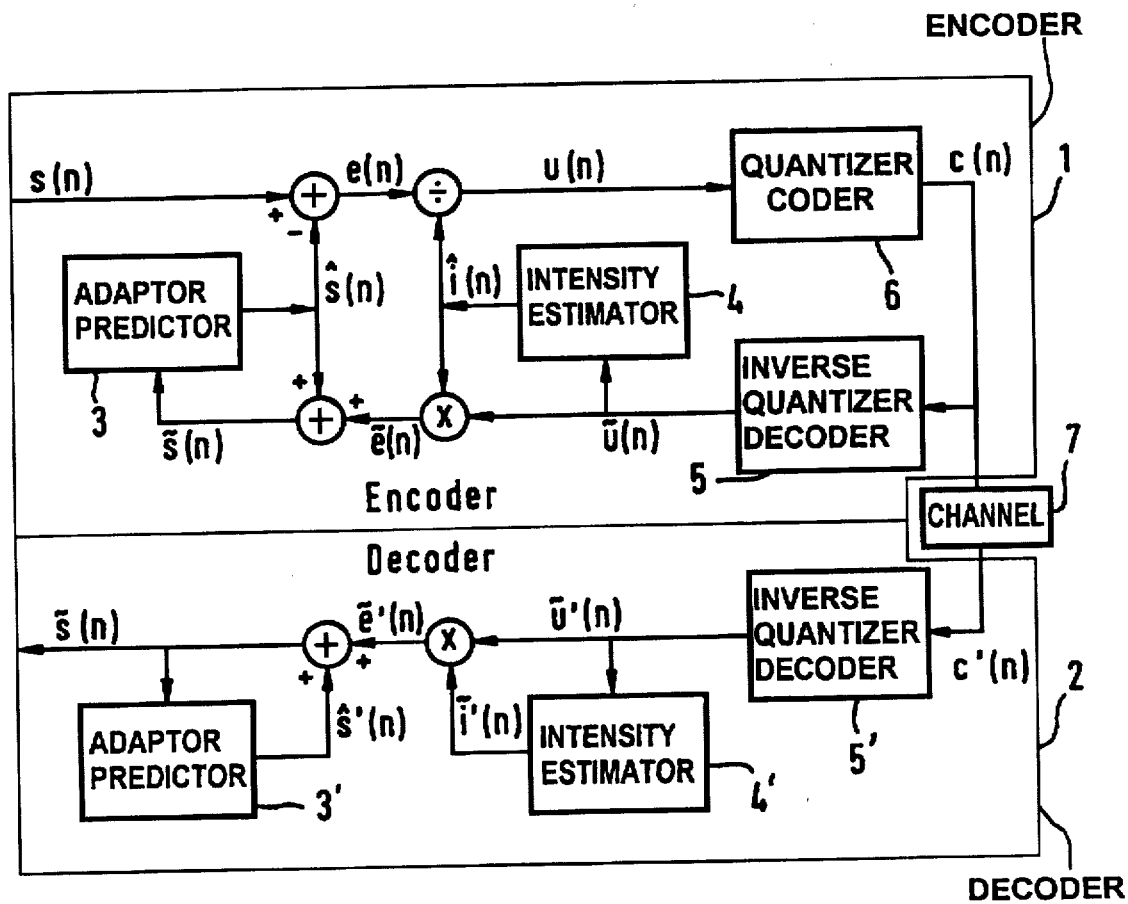
FIG. 1 is a block diagram of a broadband ADPCM-CODEC for the implementation of the method of the present invention.

The block circuit diagram in FIG. 1 shows signals and function blocks of an encoder 1 and a decoder 2. A respective adaptor predictor 3, 3', an intensity estimator 4, 4' and a decoder 5, 5' are respectively contained in the encoder 1 and in the decoder 2. Also, the encoder 1 has a coder 6.

The functioning modes of encoder 1 and decoder 2 shall be explained first with reference to signal curves. The input signal s(n) of the encoder 1 is a voice signal digitized with a sampling frequency of 16 kHz. The estimated input signal ŝ(n) is subtracted from the digitized input signal s(n) and only a remaining remainder signal e(n) is further-processed. It is first normed in that it is divided by its estimated intensity î(n). The normalized signal u(n) that has arisen as a result thereof is supplied to the quantizer/coder 6. The encoder output signal c(n) thereof is the signal that is transmitted via the channel 7. The encoder output signal c(n) has a transmission rate of 16 kHz and has a resolution of 4 bits. A bit rate of 64 kbit/s on the channel 7 results therefrom. Since decoder 5, 5', intensity estimator 4, 4' and predictor 3, 3' of the encoder 1 and decoder 2 are identically constructed, identical signal conditions in the encoder 1 and decoder 2 derive given faultless transmission. Only the further signal curve in the encoder 1 shall therefore be considered below.

The digitized input signal c(n) first proceeds to the decoder 5 and subsequently proceeds to the inverse quantizer contained therein, the inverse quantizer signal ũ(n), that is output by the inverse quantizer, being multiplied by the estimated intensity î(n) in order to implement a denorming procedure. As a result of the preceding quantization in the coder 6, however, the signal u(n) cannot be exactly reconstructed. It is superimposed with additional quantization noise.

The error signal ẽ(n) that proceeded from the multiplication of î(n) with ũ(n) is added to the estimated input signal ŝ(n) to produce a control signal s̃(n). This control signal controls the predictor 3 that generates the estimated input signal ŝ(n). The control signal s̃(n) in the decoder 2 is also the decoder output signal of the decoder 2.

Figure 2:
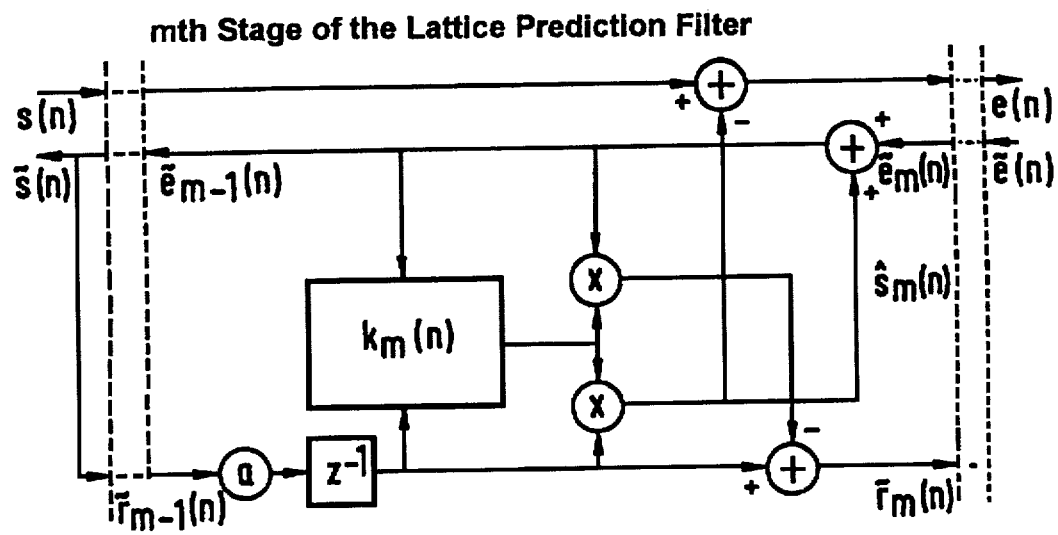
FIG. 2 is a block diagram of the prediction filter of the arrangement of FIG. 1.

The predictor 3 has the function of predicting the input signal s(n) of the encoder 1 as exactly as possible. It forms the remainder signal e(n) from s(n) and the estimated input signal ŝ(n). The signal e(n) exhibits less redundancy compared to s(n). Given an adequately high degree of prediction, the remainder signal is a noise signal. The non-recursive predictor 3 of the third order has what is referred to as a lattice structure. FIG. 2 shows the mth stage of this structure. The advantage of this structure is the decoupling of the prediction filter coefficients of the individual stages from one another. Over and above this, the stability of the filter can be identified merely on the basis of the size of the coefficient. The sufficient condition of the stability of the filter reads: $|k_m|<1$. FIG. 2 shows one stage of the prediction filter. The updating of the prediction filter coefficient ensues in the sampling clock.

In the back-prediction, the predictors in the encoder 1 and in the decoder 2 are supplied with control signals s̃(n) in the case of faultless transmission, whereby s̃(n) is the sum of the received error signal ẽ(n) and the estimated input signal ŝ(n).

Various methods are known for the updating of the prediction filter coefficients. One of these is what is referred to as the product operational sign method (PVM). One of its advantages is that it is managed without divisions, this being felt in the need for calculating performance in the implementation of the code. Divisions are usually iteratively calculated by microprocessors and therefore require substantially more calculating time than additions and multiplications that, for example, are implemented by digital signal processors in one instruction cycle. Equations (1) and (2) describe the product operational sign method.

$$\rho_{e,r,m}^{t-}(n+1) = (1-b)*\rho_{e,r,m}^{t-}(n) + b*\text{sign}(\tilde{e}_{m-1}(n))*\text{sign}(\tilde{r}_{m-1}(n-1)) \quad (1)$$

$$k_m(n+1) = \sin\left(\frac{\pi}{2} * \rho_{e,r,m}^{t}(n-1)\right) \quad (2)$$

$\rho_{e,r,m}^{s}(n)$ is the polarity correlation coefficient of the sequences $\tilde{e}_{m-1}(n)$ and $\tilde{r}_{m-1}(n)$ (see FIG. 2.)

The values of the sine function need not be calculated. They can be read from a look-up table. The signal-to-noise ratio (SNR) and the predication gain Gp were measured from voice samples with a male and female voice. The prediction gain amounted to approximately 16.5 dB and the SNR amounted to approximately 32 dB.

The SNR was calculated according to equation (3), whereby $s_{in}$ references the encoder input signal and $s_{out}$ references the decoder output signal.

$$SNR = 10*\log\left(\frac{\sum_i s_{in}^2(i)}{\sum_i (s_{in}(i) - s_{out}(i))^2}\right) \quad (3)$$

The prediction gain Gp is calculated in the following way:
$Gp = \sigma_s^2/\sigma_e^2$ $\sigma_s^2 =$ variance $(s(n))$, $\sigma_e^2 =$ variance $(e(n))$.

The quantizer 6 of the codec of FIG. 1 works with fixed quantization levels. In order to achieve an optimally good modulation of the quantizer and, thus, to keep the quantization noise power low, the error signal is normed before the quantization. The norming ensues by dividing the remainder signal $e(n)$ by its estimated intensity $\hat{i}(n)$. This is identified in the intensity estimator. Given a faultless data transmission, the intensity estimator in the decoder and encoder are supplied with identical signals $\tilde{u}(n)$ from the respective inverse quantizer/decoder.

Figure 3:
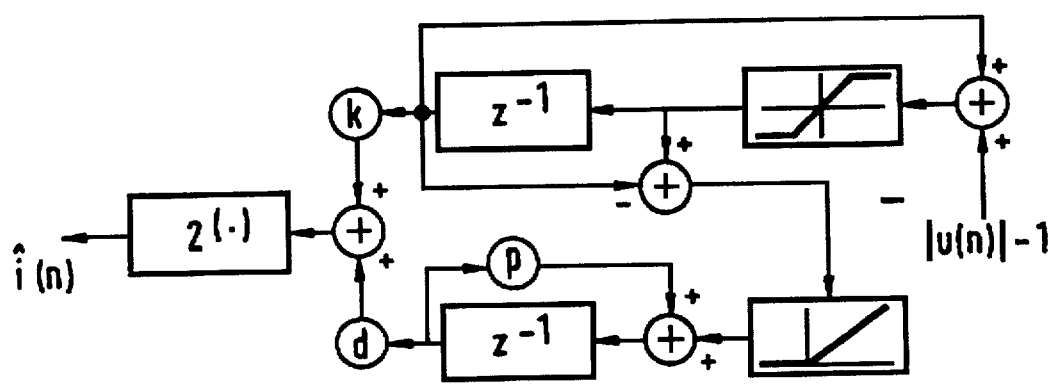
FIG. 3 is a block diagram of the intensity estimator of the arrangement according to FIG. 1.

FIG. 3 shows the block circuit diagram of the intensity estimator. The amount of the signal $\tilde{u}(n)$ is first formed in the upper branch. A low-frequency signal arises as a result thereof, this describing the intensity curve of the signal $u(n)$ from the decoder 2. At the same time, this signal forms an estimated value for the sequence $u(n)$ preceding the quantizer. Deviations of the amount of $\tilde{u}(n)$ from one are accommodated upon attenuation of the higher-frequency signal parts and $\hat{i}(n)$ that is independent of the intensity of the sequence $e(n)$. The estimated intensity $\hat{i}(n)$ represents the envelope of the prediction error signal (remainder signal $e(n)$). The upper branch cannot react quickly enough to sudden intensity elevations. A further branch therefore exists wherein this is taken into consideration. An intensity boost thereby effects an additional increase in the intensity estimated value. The values for k, d and p were experimentally identified and taken from the prior art.

Figure 4:
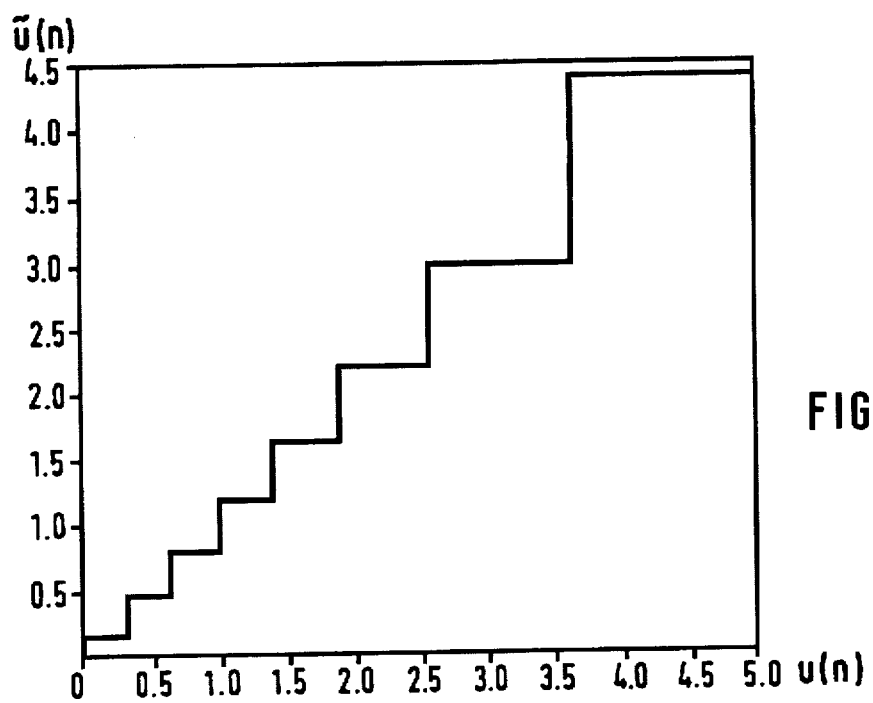
FIG. 4 is a graph positive part of the quantization characteristic for the arrangement of FIG. 1.

The normed prediction error signal $u(n)$ is coded with a 16-stage quantizer 6 to form a 4-bit word. The quantization stages were calculated from the amplitude density distributions of the normed prediction error signal $u(n)$ from the point of view of minimum quantizer noise power. The following table contains the eight positive intervals of the quantizer 6 and the quantized values and code words belonging thereto. Over and above this, the occurrences of the amplitude intervals calculated on the basis of speech samples are listed. The negative characteristic of the quantizer 6 is symmetrical to the positive, as shown in FIG. 4.

| Interval | Upper Limit | Quantized u(n) | Occurrence Value p(u(n)) | Code Word c(n) |
|---|---|---|---|---|
| 0 | 0.000 | — | — | — |
| 1 | 0.305 | 0.151 | 0.144 | 000 |
| 2 | 0.629 | 0.459 | 0.112 | 001 |
| 3 | 0.993 | 0.799 | 0.089 | 010 |
| 4 | 1.409 | 1.187 | 0.066 | 011 |
| 5 | 1.915 | 1.632 | 0.046 | 100 |
| 6 | 2.589 | 2.195 | 0.028 | 101 |
| 7 | 3.628 | 2.983 | 0.012 | 110 |
| 8 | — | 4.382 | 0.003 | 111 |

The described coding method was implemented in the digital signal processor (DSP) Motorola DSP 56001. This implementation was utilized in the field of voice storage. The DSP 56001 works with 24-bit fixed decimal point arithmetic, so that all variables and constants of the code are presented with 24-bit precision. Calculations were implemented on the basis of the expanded accumulator register of the DSP with 48-bit or, respectively, with 56-bit precision.

Figure 5:
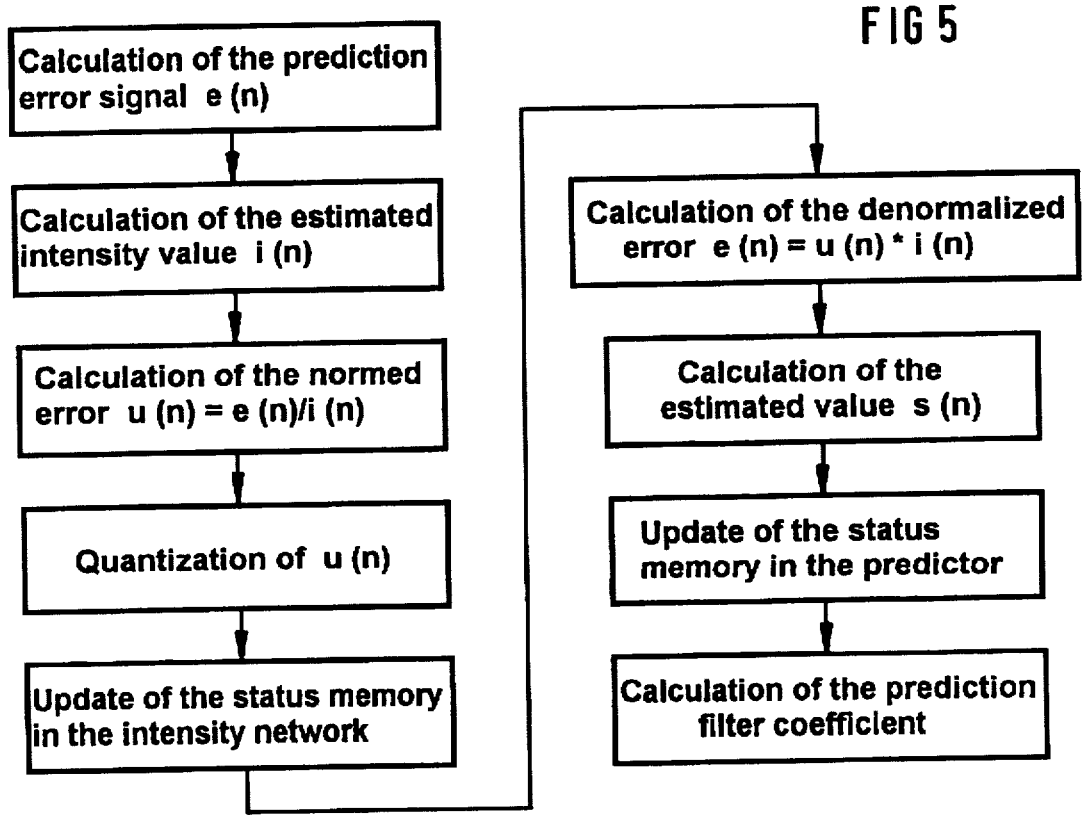
FIG. 5 depicts the program structure of the voice storage module for the arrangement of FIG. 1.

FIG. 5 shows the flow chart of the encoder 1. The decoder 2 is similarly structured; the routines of calculating and quantizing $u(n)$ are omitted therein. Since encoder 1 and decoder 2 cannot be simultaneously operated on the target hardware, their shared routines are contained only once in the program code. This measure leads to a saving of storage location that corresponds to the scope of the decoder.

A low calculating time requirement was taken into consideration in the implementation of the method on the basis of technical frame conditions. One measure for reducing the calculating time required is the simplified calculation of the described intensity estimated value $\hat{i}(n)$. In the description of the known coding method, $i(n)$ is calculated using the exponential function $2^x$ that is implemented by the signal processor, for example on the basis of a polynomial approximation. A number of programs steps are usually required for this purpose.

In the modified version of the method, only the whole-numbered part of the exponent is taken into consideration in the calculation of $i(n)$. As a result thereof, the exponential function can be reduced to simple bit-shift operations. This simplification leads to a reduction of 12% in the required calculating time. Over and above this, the memory location requirements are approximately 10% lower. However, an increase in the amplitudes of the remainder signal, leads to a higher quantization error.

When comparing the two methods, that with only whole-numbered exponents has a SNR that is lower by 0.7 dB compared to the method with polynomial approximation (SNR given polynomial approximation: approximately 33 dB). This difference is not capable of being perceived in subjective hearing tests.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for coded transmission of voice signals, comprising the steps of:

digitizing a voice signal, supplying the digitized voice signal to an encoder, and subtracting an estimated input signal from the digitized voice signal to provide a remainder signal;

normalizing the remainder signal by dividing the remainder signal by an estimated intensity signal thereof to produce normalized signal;

supplying the normalized signal to a quantizer/coder that outputs an encoder output signal;

transmitting the encoder output signal of the qantizer/coder via a channel to a means for decoding the encoder output signal, and also supplying the encoder output signal to an inverse quantizer that outputs an inverse quantizer signal that is multiplied by the estimated intensity signal to provide a result signal;

adding the result signal to the estimated input signal to form a control signal for a predictor which generates the estimated input signal; and the estimated intensity signal being calculated by forming a magnitude of the inverse quantizer signal, the calculation of the estimated intensity using an exponential function $2^x$, where only a whole-numbered part of x is taken into consideration, accumulating deviations of the magnitude of the inverse quantizer signal from a value of one and limiting the deviations by attenuation of higher-frequency signal parts thereof.

2. The method according to claim 1, wherein the means for decoding is a decoder, and wherein the method further comprises the steps of:

receiving the encoder output signal in the decoder;

supplying, in the decoder, the encoder output signal to an inverse quantizer that outputs an inverse quantizer signal;

supplying, in the decoder, the inverse quantizer signal to an intensity estimator that outputs an estimated intensity signal;

multiplying, in the decoder, the inverse quantizer signal by the estimated intensity signal to produce an error signal;

adding, in the decoder, the error signal to an estimated input signal to produce a control signal, the control signal being a decoder output signal of the decoder; and supplying, in the decoder, the control signal to a predictor that outputs the estimated input signal.

3. A method for coded transmission of voice signals, comprising the steps of:

digitizing a voice signal, supplying the digitized voice signal to an encoder, and subtracting an estimated input signal from the digitized voice signal to provide a remainder signal;

normalizing the remainder signal by dividing the remainder signal by an estimated intensity signal thereof to produce a normalized signal;

supplying the normalized signal to a quantizer/coder that outputs an encoder output signal;

transmitting the encoder output signal of the quantizer/coder via a channel to a means for decoding the encoder output signal, and also supplying the encoder output signal to an inverse quantizer that outputs an inverse quantizer signal that is multiplied by the estimated intensity signal to provide a result signal;

adding the result signal to the estimated input signal to form a control signal for a predictor which generates the estimated input signal; and the estimated intensity signal being calculated by forming a magnitude of the inverse quantizer signal, accumulating deviations of the magnitude of the inverse quantizer signal from a value of one and limiting the deviations by attenuation of higher-frequency signal parts thereof, the calculation of the estimated intensity signal using an exponential function $2^x$, where only a whole-numbered part of x is taken into consideration.

4. The method according to claim 3, wherein the means for decoding is a decoder, and wherein the method further comprises the steps of:

receiving the encoder output signal in the decoder;

supplying, in the decoder, the encoder output signal to an inverse quantizer that outputs an inverse quantizer signal;

supplying, in the decoder, the inverse quantizer signal to an intensity estimator that outputs an estimated intensity signal;

multiplying, in the decoder, the inverse quantizer signal by the estimated intensity signal to produce an error signal;

adding, in the decoder, the error signal to an estimated input signal to produce a control signal, the control signal being a decoder output signal of the decoder; and supplying, in the decoder, the control signal to a predictor that outputs the estimated input signal.

5. A method for coded transmission of voice signals, comprising the steps of:

digitizing a voice signal and supplying the digitized voice signal to an encoder;

subtracting, in the encoder, an estimated input signal from the digitized voice signal to produce a remainder signal;

normalizing, in the encoder, the remainder signal by dividing the remainder signal by an estimated intensity signal thereof to produce a normalized signal;

supplying, in the encoder, the normalized signal to quantizer/coder that outputs an encoder output signal;

supplying, in the encoder, the encoded output signal to an inverse quantizer that outputs an inverse quantizer signal;

supplying, in the encoder, the inverse quantizer signal to an intensity estimator that outputs the estimated intensity signal;

multiplying, in the encoder, the inverse quantizer signal by the estimated intensity signal to produce an error signal;

adding, in the encoder, the error signal to the estimated input signal to produce a control signal;

supplying, in the encoder, the control signal to a predictor that outputs the estimated input signal;

transmitting the encoder output signal from the encoder to a decoder;

receiving the encoder output signal in the decoder;

supplying, in the decoder, the encoder output signal to an inverse quantizer that outputs an inverse quantizer signal;

supplying, in the decoder, the inverse quantizer signal to an intensity estimator that outputs an estimated intensity signal;

multiplying, in the decoder, the inverse quantizer signal by the estimated intensity signal to produce an error signal;

adding, in the decoder, the error signal to an estimated input signal to produce a control signal, the control signal being a decoder output signal of the decoder;

supplying, in the decoder, the control signal to a predictor that outputs the estimated input signal;

the estimated intensity signal, in each of the encoder and decoder, being calculated by forming a magnitude of a respective inverse quantizer signal, accumulating deviations of the magnitude of the respective inverse quantizer signal from a value of one, and limiting the deviations by attenuation of higher-frequency signal parts thereof, in each of the encoder and decoder, the calculation of the respective estimated intensity signal using an exponential function $2^x$, where only a whole-numbered part of x is taken into consideration.

* * * * *